(12) United States Patent
Boon (10) Patent No.: US 10,818,995 B2
(45) Date of Patent: Oct. 27, 2020

(54) RADIO FREQUENCY (RF) CONNECTION ASSEMBLY INCLUDING A PIN AND BEAD ASSEMBLY WITH A SMOOTH INNER EDGE

(71) Applicant: Keysight Technologies, Inc., Santa Rosa, CA (US)

(72) Inventor: Wei-Chong Boon, Penang (MY)

(73) Assignee: Keysight Technologies, Inc., Santa Rosa, CA (US)

(*) Notice: Subject to any disclaimer, the term of this patent is extended or adjusted under 35 U.S.C. 154(b) by 0 days.

(21) Appl. No.: 16/547,682

(22) Filed: Aug. 22, 2019

(65) Prior Publication Data

US 2020/0168973 A1    May 28, 2020

Related U.S. Application Data

(60) Provisional application No. 62/770,920, filed on Nov. 23, 2018.

(51) Int. Cl.

| | |
|---|---|
| *H01P 5/02* | (2006.01) |
| *H01R 13/512* | (2006.01) |
| *H01R 13/52* | (2006.01) |
| *G01R 1/067* | (2006.01) |
| *H01R 13/11* | (2006.01) |
| *H01R 13/03* | (2006.01) |
| *H01R 24/40* | (2011.01) |

(52) U.S. Cl.
CPC ............ *H01P 5/02* (2013.01); *G01R 1/06772* (2013.01); *H01R 13/03* (2013.01); *H01R 13/111* (2013.01); *H01R 13/512* (2013.01); *H01R 13/521* (2013.01); *H01R 24/40* (2013.01)

(58) Field of Classification Search
CPC .... H01R 13/03; H01R 13/111; H01R 13/512; H01R 13/521; H01R 24/38; H01R 24/40; H01R 2201/24
See application file for complete search history.

(56) References Cited

U.S. PATENT DOCUMENTS

| | | | | | |
|---|---|---|---|---|---|
| 3,609,637 | A | * | 9/1971 | Cole .................... | H01R 13/627 439/349 |
| 3,678,447 | A | * | 7/1972 | Ziegler, Jr. ........... | H01R 9/0521 439/585 |
| 3,723,944 | A | * | 3/1973 | Gauchat ........... | H01R 13/62933 439/255 |
| 4,125,308 | A | * | 11/1978 | Schilling ................. | H01P 5/085 439/63 |

(Continued)

*Primary Examiner* — Oscar C Jimenez (57) ABSTRACT

An RF connection assembly is provided for DC to mmWave signals. The RF connection assembly includes a GTMS assembly including a shroud, glass insulation filling a portion of the shroud to define an inner recess, and a gold plated GTMS center conductor secured by the glass insulation and protruding from the inner recess; and a pin and bead assembly including an RF center conductor including a clamping mechanism having a collar, and a center socket defined by the clamping mechanism, the center socket being accessible through an opening in the collar. The collar has a smooth inner edge around a perimeter, configured to guide a tip of the GTMS center conductor into the center socket of the RF center conductor for connecting the GTMS assembly and the pin and bead assembly, minimizing scraping of the GTMS center conductor by the inner edge of the opening.

20 Claims, 9 Drawing Sheets

(56) References Cited

U.S. PATENT DOCUMENTS

| | | | | |
|---|---|---|---|---|
| 4,368,940 | A * | 1/1983 | Sugiura | H01R 24/52 |
| | | | | 439/170 |
| 4,648,683 | A * | 3/1987 | Botka | H01R 24/44 |
| | | | | 439/583 |
| 5,454,735 | A * | 10/1995 | Nelson | H01R 13/6277 |
| | | | | 439/578 |
| 5,879,176 | A * | 3/1999 | Stimson | H01R 13/7035 |
| | | | | 439/188 |
| 6,024,609 | A * | 2/2000 | Kooiman | H01R 24/40 |
| | | | | 411/433 |
| 6,884,115 | B2 * | 4/2005 | Malloy | H01R 9/0521 |
| | | | | 439/584 |
| 2007/0105417 | A1 * | 5/2007 | Camelio | H01R 13/6277 |
| | | | | 439/133 |
| 2009/0004906 | A1 * | 1/2009 | Koch | H01R 13/6277 |
| | | | | 439/352 |
| 2011/0207368 | A1 * | 8/2011 | Takada | B60L 53/16 |
| | | | | 439/519 |
| 2013/0143430 | A1 * | 6/2013 | Sorolla Rosario | H01R 9/05 |
| | | | | 439/485 |
| 2013/0157506 | A1 * | 6/2013 | Grek | H01R 9/0521 |
| | | | | 439/578 |
| 2013/0203278 | A1 * | 8/2013 | Fisher, Jr. | H02G 15/04 |
| | | | | 439/275 |
| 2016/0322751 | A1 * | 11/2016 | Van Swearingen | |
| | | | | H01R 13/642 |
| 2017/0310062 | A1 * | 10/2017 | Eriksen | H01R 13/111 |
| 2019/0219631 | A1 * | 7/2019 | An | G01R 31/69 |
| 2019/0267762 | A1 * | 8/2019 | Zhang | H01R 13/111 |
| 2019/0341733 | A1 * | 11/2019 | Stevens | H01R 43/26 |
| 2020/0059050 | A1 * | 2/2020 | Meshram | H01R 13/639 |

\* cited by examiner

RADIO FREQUENCY (RF) CONNECTION ASSEMBLY INCLUDING A PIN AND BEAD ASSEMBLY WITH A SMOOTH INNER EDGE

CROSS REFERENCE TO RELATED APPLICATIONS

The present application claims priority under 35 U.S.C. § 119(e) to U.S. Provisional Application No. 62/770,920, filed on Nov. 23, 2018, and naming Wei Chong Boon inventor. The entire disclosure of U.S. Provisional Application No. 62/770,920 is hereby specifically incorporated by reference in its entirety.

BACKGROUND

A glass-to-metal-seal (GTMS) assembly is an environmentally sealed electrical connector for passing an electromagnetic signal, such as a radio frequency (RF) signal. For example, a GTMS assembly may provide a hermetic and/or airtight seal to ensure a dependable, high performance electrical connection in various environmental conditions, such as extreme temperature, pressure, moisture, and vibration. A GTMS assembly for an RF connection generally provides a single pin or center conductor within a metal shroud, where the center conductor is formed of gold plated metal. Glass melted to the center conductor and shroud creates an air-tight barrier, and to provides electrical insulation. The GTMS assembly is typically used at high frequencies of RF signals, up to about 110 GHz.

A GTMS assembly may be insertably mated with a pin and bead assembly to establish an RF connection assembly that connects to an RF connector (or similar RF connection assembly) of another device, such as a test instrument or a device under test (DUT), for example. The RF connection assembly may assembled by inserting the gold plated GTMS center conductor of the GTMS assembly into the pin and bead assembly to form an electrical (signaling) connection. An example of a conventional device using an RF connection assembly having a GTMS assembly to establish an RF connection is a DC-67 GHz power splitter, such as a 11667CH67 DC-67 GHz power splitter, available from Keysight Technologies, Inc.

However, the soft gold plating on the GTMS center conductor scrapes off during insertion (and removal) of the GTMS center conductor into a receptacle assembly, such as a pin and bead assembly, resulting in damage to the GTMS center conductor and/or collection of gold shavings around a base of the GTMS center conductor. More particularly, the gold plating is scraped off by sharp inner edges (e.g., chamfered edges) of the receptacle assembly. The scraped gold plating collects as gold shavings that generally stick upward and/or have irregular shapes at the base of the GTMS center conductor, causing the scraped gold plating to effectively act as tiny antennas that cause mismatch at the transmission line or path, resulting in reduced performance and/or RF failure. Also, scoring of the soft gold plating may occur through the insertion (and removal) of the GTMS center conductor, further damaging the GTMS center conductor.

For example, through empirical testing of a DC-67 GHz power splitter as a DUT, connected for example to a performance network analyzer, it has been observed that a one-time connection between a GTMS assembly and a conventional pin and bead assembly (with chamfered edges) yields passing rates of only about 75 percent, and that two-time connections (with intervening disconnection) yield passing rates of only about 30 percent, due to damage to the GTMS center conductor. A damaged GTMS center conductor weakens the electrical connection, resulting in reduced performance and/or failure of the RF connection assembly. Accordingly, an RF connection assembly is needed that preserves the gold plating and otherwise provides reliable electrical connections.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 1:
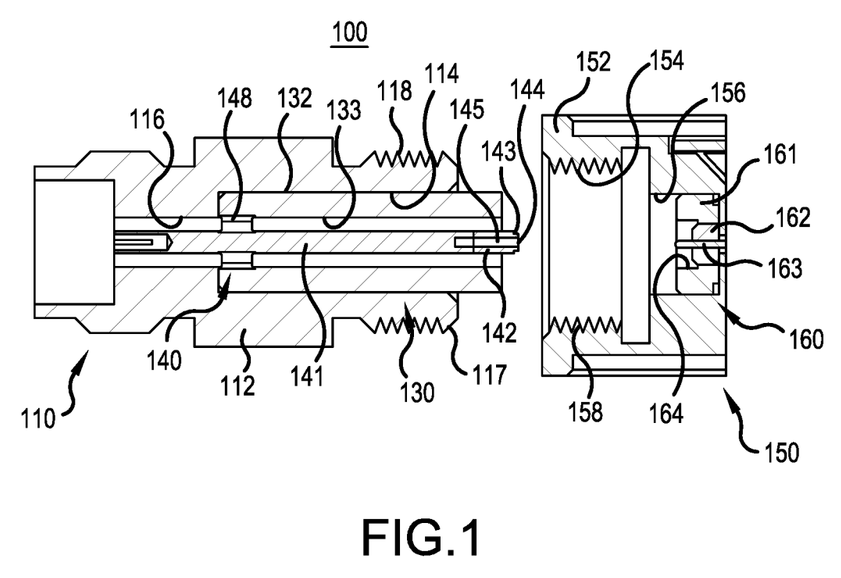
FIG. 1 is a simplified cross-sectional view of a radio frequency (RF) connection assembly, in a disconnected state, according to a representative embodiment.

FIG. 1 is a cross-sectional view of a radio frequency (RF) connection assembly, in a disconnected state, according to a representative embodiment. The RF connection assembly may be for establishing signal connections for DC to mmWave RF signals, for example.

Referring to FIG. 1, RF connection assembly 100 includes an RF connector 110 and a GTMS connector 150. The RF connector 110 includes an RF connector sub-assembly 130, an outer conductor 112, with an outer opening 114 and an inner opening 116 formed in the outer conductor 112. The outer opening 114 may be substantially cylindrically shaped, and extends partially through the outer conductor 112 from a distal end of the RF connector 110. The inner opening 116 may also be substantially cylindrically shaped, and further extends partially through the outer conductor 112 from a bottom portion of the outer opening 114. In the depicted embodiment, the inner opening 116 has a diameter smaller than a diameter of the outer opening 114. Threading 118 is on an outer surface of an end portion 117 of the outer conductor 112, enabling a thread-in connection with the GTMS connector 150 in a connected state, as discussed below.

The RF connector sub-assembly 130 includes a sleeve 132 that defines a core opening 133, which extends longitudinally through an entire length of the sleeve 132. The sleeve 132 may be formed of beryllium copper, for example. The RF connector sub-assembly 130 further includes a pin and bead assembly 140, which is insertably positioned in the core opening 133 of the sleeve 132. The pin and bead assembly 140 includes an RF center conductor (pin) 141 and a bead 148 surrounding the RF center conductor 141 at a waist portion of the RF center conductor 141. The bead 148 has a bead outer diameter (e.g., about 2.045 mm), which is substantially the same as an inner diameter of the core opening 133 (e.g., about 1.85 mm), and the bead 148 has a bead inner diameter (e.g., about 0.715 mm), which is substantially the same as an outer diameter of the RF center conductor 141 (e.g., about 0.804 mm). Therefore, the RF center conductor 141 is securely fitted within the bead 148, and the bead 148 is securely fitted within the core opening 133 of the sleeve 132, such that the bead 148 secures the RF center conductor 141 at a proximal end of the sleeve 132 in which the RF center conductor 141 is inserted. In an embodiment, the RF center conductor 141 may have a small step of undercut with an outer diameter of about 0.711 mm and a length of about 1.348 mm, for example, to further secure the bead 148 at a fixed location on the RF center conductor 141. Of course, the dimensions referenced above are illustrative, and other dimensions may be incorporated without departing from the scope of the present teachings. In the assembled state, the end of the sleeve 132 fits into the outer opening 114 of the outer conductor 112, and the end of the RF center conductor 141 that extends beyond the sleeve 132 fits into the inner opening 116 of the outer conductor 112.

The RF center conductor 141 is formed of metal with gold plating, and is electrically connected to a cable (center conductor) or other signal conductor (not shown) for conducting electromagnet signals, such as mmWave RF signals. For example, the RF center conductor 141 may be formed of gold plated beryllium copper, although different materials may be incorporated without departing from the scope of the present teachings.

As discussed below in greater detail, the RF center conductor 141 includes a clamping mechanism 142 at a distal end portion. In an embodiment, the RF center conductor 141 is a one piece, machined part with the clamping mechanism 142 formed integrally at the distal end portion. The clamping mechanism 142 is configured to provide a good quality connection with a mating part from the GTMS connector 150, such as GTMS center conductor 163, discussed below. The RF center conductor 141 also includes a collar 143 at a distal tip of the RF center conductor 141 (which corresponds to a distal tip of the clamping mechanism 142, as well). The collar 143 defines an opening 144. The RF center conductor 141 defines a center socket 145, which extends longitudinally through at least a length of the clamping mechanism 142, and may further extend past the end of the clamping mechanism 142 into the body of RF center conductor 141. In other words, at least a portion of the center socket 145 is defined by the clamping mechanism 142, where the center socket 145 is accessible through the opening 144 in the collar 143. The collar 143 has a smooth inner edge (not shown in FIG. 1) around a perimeter of the opening 144, as discussed below.

The RF connector 110, including the RF connector sub-assembly 130 and the pin and bead assembly 140, may be any of various sizes. For example, standardized types or sizes of the RF connector 110 include 1.00 mm, 1.85 mm, 2.40 mm and 3.50 mm, although other sizes of the RF connector 110 may be incorporated without departing from the scope of the present teachings. The 1.00 mm RF connector 110 may be for mmWave signal bands having an upper frequency of about 110 GHz. The 1.85 mm RF connector 110 may be for mmWave signal bands having an upper frequency of about 70 GHz. The 2.40 mm RF connector 110 may be for mmWave signal bands having an upper frequency of about 50 GHz. The 3.50 mm RF connector 110 may be for mmWave signal bands having an upper frequency of about 34 GHz.

The GTMS connector 150 includes a GTMS housing 152, with an outer opening 154 and an inner opening 156 formed in the GTMS housing 152. The outer opening 154 may be substantially cylindrically shaped, and extends partially through the GTMS housing 152 from a distal end of the GTMS connector 150. The inner opening 156 may also be substantially cylindrically shaped, and further extends partially through the GTMS housing 152 from a bottom portion of the outer opening 154. In the depicted embodiment, the inner opening 156 has a diameter smaller than a diameter of the outer opening 154. Threading 158 is on an inner surface of an end portion of the outer opening 154, enabling a thread-in connection between the threading 158 and the threading 118 on the outer surface of the end portion of the outer conductor 112 to provide a secure connection. That is, the threading 118 and the threading 158 are complementarily threaded, enabling the thread-in connection.

The GTMS connector 150 further includes a GTMS assembly 160 positioned within the inner opening 156. The GTMS assembly 160 includes a shroud 161, glass insulation 162 filling a portion of the shroud 161, and a GTMS center conductor 163. The glass insulation 162 defines an inner recess 164 within the shroud 161, which corresponds to a portion of the shroud 161 not filled by the glass insulation 162. The GTMS center conductor 163 is secured in place by the glass insulation 162, and protrudes from the inner recess 164, extending beyond an outer edge of the shroud 161. The GTMS center conductor 163 is formed of metal with gold plating, and is electrically connected to a cable (center conductor) or other signal conductor (not shown) for conducting electromagnet signals, such as mmWave RF signals. The GTMS center conductor 163 may be formed of gold plated tungsten wire, or gold plated Kovar wire, for example, although though different materials may be incorporated without departing from the scope of the present teachings.

Figure 2A:
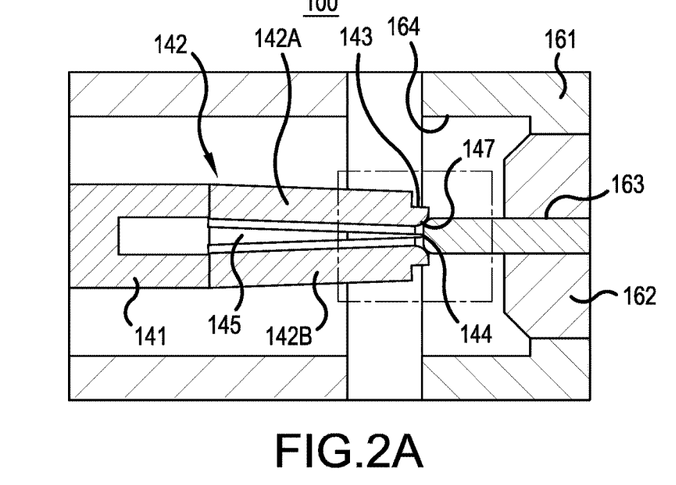
FIG. 2A is a simplified cross-sectional view of the RF connection assembly shown in FIG. 1, in a partially connected state, according to a representative embodiment.
Figure 2B:
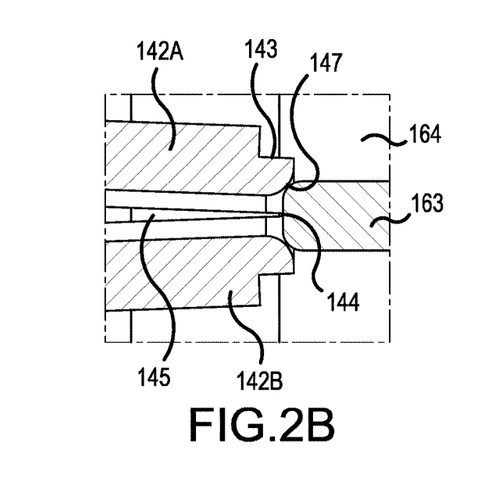
FIG. 2B is a zoomed-in cross-sectional view of a portion of the RF connection assembly shown in FIG. 2A, in the partially connected state, according to a representative embodiment.

FIG. 2A is a cross-sectional view of the RF connection assembly shown in FIG. 1, in a partially connected state, according to a representative embodiment, and FIG. 2B is a zoomed-in cross-sectional view of a portion of the RF connection assembly shown in FIG. 2A, in the partially connected state, according to a representative embodiment. In particular, FIGS. 2A and 2B show the GTMS center conductor 163 of the GTMS assembly 160 making initial contact with the collar 143 of the RF center conductor 141.

Figure 3A:
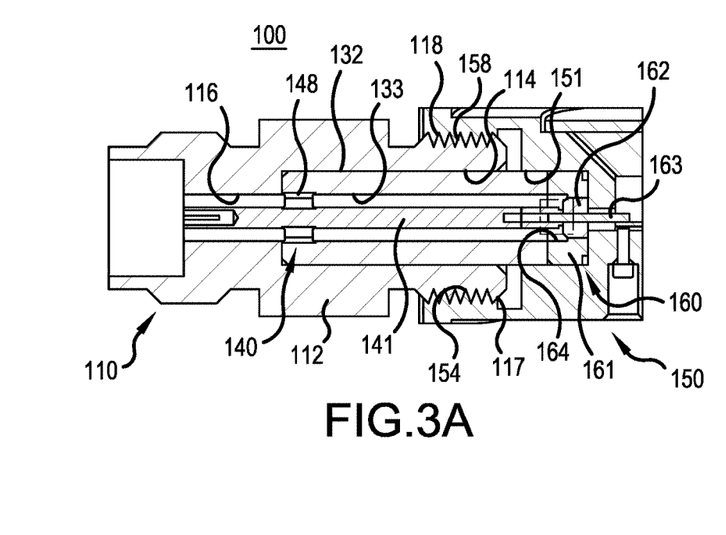
FIG. 3A is a simplified cross-sectional view of the RF connection assembly shown in FIG. 1, in a fully connected state, according to a representative embodiment.
Figure 3B:
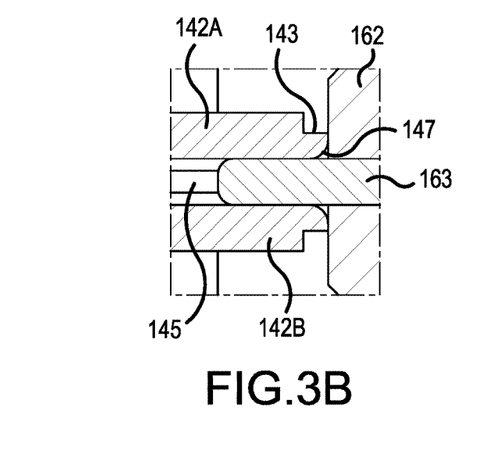
FIG. 3B is a zoomed-in cross-sectional view of a portion of the RF connection assembly shown in FIG. 3A, in the fully connected state, according to a representative embodiment.

Referring to FIGS. 2A and 2B, the RF center conductor 141 includes the clamping mechanism 142, which defines at least in part the center socket 145. In the depicted embodiment, the clamping mechanism 142 includes multiple fingers, indicated by fingers 142A and 142B, surrounding the center socket 145. The fingers 142A and 142B are shown in a relaxed state, i.e., where the GTMS center conductor 163 is not inserted in the center socket 145. When the GTMS center conductor 163 is inserted (as shown in FIGS. 3A and 3B), the fingers 142A and 142B are forcibly separated and thus exert an inward clamping force on the GTMS center conductor 163, helping to hold the GTMS center conductor 163 in place. In an embodiment, the clamping mechanism 142 has four fingers (including fingers 142A and 142B) that are arranged symmetrically around the center socket 145. The collar 143 is likewise segmented into four portions corresponding to the four fingers of the clamping mechanism 142, such that the four portions of the collar 143 separate as the four fingers are separated apart from one another at the distal end portion in response to receiving the GTMS center conductor 163. In alternative embodiments, the clamping mechanism 142 may include fewer or more than four fingers to exert the inward clamping force on the GTMS center conductor 163, or may include another type of connector, such as a slotless female center connector for example, without departing from the scope of the present teachings.

As shown more clearly in FIGS. 2A and 2B, the RF center conductor 141 includes the collar 143 at its distal tip (which corresponds to the distal tip of the clamping mechanism 142). The collar 143 defines an opening 144, which leads to the center socket 145 extending longitudinally through at least the clamping mechanism 142 of the RF center conductor 141, such that the center socket 145 is accessible through the opening 144 in the collar 143. The collar 143 has a smooth inner edge 147 around the perimeter of the opening 144, as opposed to a sharp, chamfered inner edge. The smooth inner edge 147 is located in a position where a distal tip of the GTMS center conductor 163 initially contacts the collar 143 upon entering the clamping mechanism 142. The smooth inner edge 147 therefore provides a smooth contact area between the clamping mechanism 142 and the surface of the GTMS center conductor 163 as it is inserted into the center socket 145. In the depicted embodiment, the smooth inner edge 147 is rounded where the GTMS center conductor 163 initially contacts the collar 143. The rounded smooth inner edge 147 may have a predetermined radius of curvature, examples of which are discussed below.

Accordingly, scraping and/or scoring of the GTMS center conductor 163 by the smooth inner edge 147 of the opening 144 is minimized, thereby increasing a useful life of the GTMS center conductor 163 and better maintaining reliable electrical connectivity between the pin and bead assembly 140 (e.g., connected to a DUT) and the GTMS assembly 160 (e.g., connected to a test instrument). In comparison, a conventional RF center conductor has well defined, chambered edges around an inner diameter of an opening, as discussed below with reference to FIG. 5. The smooth inner edge 147 is therefore configured to guide the tip of the GTMS center conductor 163 into the center socket 145 of the RF center conductor 141 for connecting the GTMS assembly 160 and the pin and bead assembly 140.

In an embodiment, the smooth inner edge 147 may be rounded to provide the smooth surface contacting the GTMS center conductor 163. The rounded, smooth inner edge 147 may have different radii depending for example of the size of the pin and bead assembly 140. As mentioned above, the pin and bead assembly 140 may be one of various sizes, including standardized sizes. A radius of curvature of the rounded smooth inner edge 147 around the perimeter of the opening 144 may vary depending on the size of the pin and bead assembly 140. For example, the rounded smooth inner edge 147 may have a radius of about 0.100 mm for a 1.85 mm RF connector 110 and a 2.40 mm RF connector 110. Also, for example, the rounded smooth inner edge 147 may have a radius of about 0.020 mm for a 1.00 mm and a radius of about 0.150 mm for a 3.50 mm RF connector 110. Of course, the radius of the rounded smooth inner edge (and/or the size of the RF connector 110) may vary to provide unique benefits for any particular situation or to meet application specific design requirements of various implementations, as would be apparent to one skilled in the art.

Figure 12:
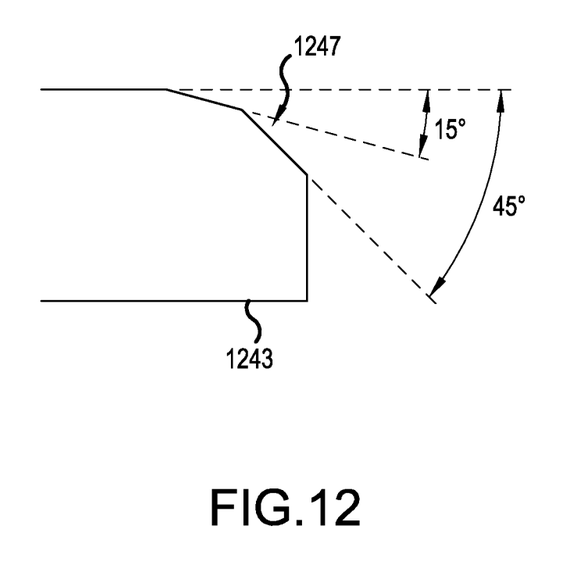
FIG. 12 is a cross-sectional view of a smooth inner edge of an opening in an RF center conductor, according to a representative embodiment.

In alternative embodiments, the smooth inner edge 147 may be provided without specifically rounding the inner edge of the smooth inner edge 147. For example, the sharp inner edge of a conventional opening may be removed by forming multiple angled inner edges, such as a two-time angled inner edge, that removes the sharpness of the chamfered inner edge. For example, FIG. 12 is a cross-sectional view of a smooth inner edge 1247 of an opening in a collar 1243 of an RF center conductor, according to a representative embodiment. In the depicted embodiment, the smooth inner edge 1247 is a two-time angled inner edge, in that a first portion of the smooth inner edge 1247 is angled at about 15 degrees and a second portion of the smooth inner edge 1247 is angled at about 45 degrees, for example. This results in three, relatively shallow obtuse angles with no sharp edges (e.g., chamfered edges). Additional angles may be included, further reducing angles between the adjacent portions.

FIG. 3A is a cross-sectional view of the RF connection assembly shown in FIG. 1, in a fully connected state, according to a representative embodiment, and FIG. 3B is a zoomed-in cross-sectional view of a portion of the RF connection assembly shown in FIG. 3A, in the fully connected state, according to a representative embodiment.

Referring to FIGS. 3A and 3B, the RF connector 110, including the inserted RF connector sub-assembly 130, is fully connected to the GTMS connector 150 of the RF connection assembly 100.

When fully connected, an end portion of the sleeve 132 is inserted in the inner opening 156 of the GTMS housing 152, and abuts the GTMS assembly 160. At the same time, the end portion 117 of the outer conductor 112 is inserted in the outer opening 154 of the GTMS housing 152. In this case, the threading 118 on the outer surface of the end portion 117 of the outer conductor 112 and the threading 158 is on the inner surface of an end portion of the outer opening 154 form a thread-in connection. Of course, other types of interconnection between the outer conductor 112 and the GTMS housing 152 may be incorporated, without departing from the scope of the present teachings.

Also when fully connected, an end portion of the RF center conductor 141 is inserted in the shroud 161 of the GTMS assembly 160, such that the end of the collar 143 of the RF center conductor 141 abuts an exposed surface of the glass insulation 162. In this position, the GTMS center conductor 163 of the GTMS assembly 160 is likewise inserted in the center socket 145 of the RF center conductor 141 through the opening 144. The GTMS center conductor 163 slides past the smooth inner edge 147 around the perimeter of the opening 144 as it is being inserted. The fingers 142A and 142B are shown in a clamping state, i.e., where the presence of the GTMS center conductor 163 forcibly separates the fingers 142A and 142B of the clamping mechanism 142. The clamping mechanism 142 thereby exerts an inward clamping force on the GTMS center conductor 163, indicated by representative arrows, helping to hold the GTMS center conductor 163 in place. In this manner, secure mechanical and electrical connections are made between the pin and bead assembly 140 and the GTMS assembly 160.

Figure 4:
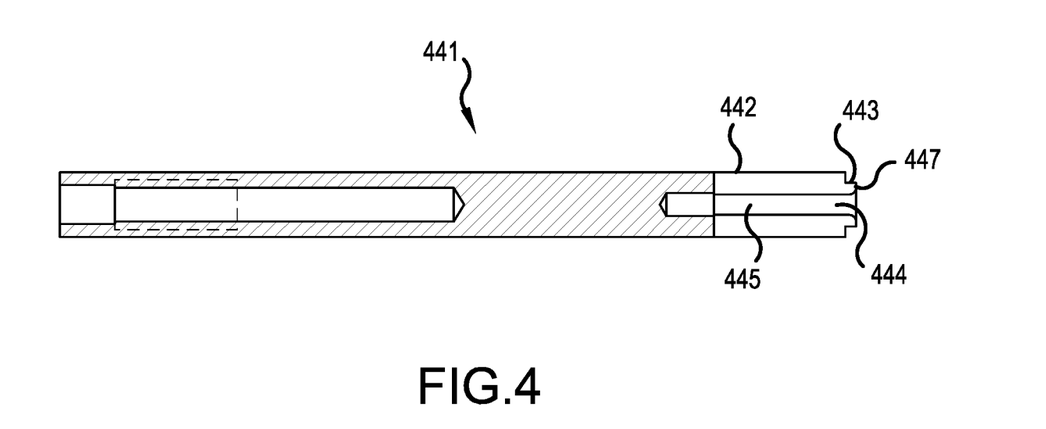
FIG. 4 is a schematic diagram of an RF center conductor of a pin and bead assembly that is part of an RF connection assembly, according to a representative embodiment.

FIG. 4 is a schematic diagram of an RF center conductor of a pin and bead assembly that is part of an RF connection assembly, according to a representative embodiment.

Referring to FIG. 4, an RF center conductor (pin) 441 of a pin and bead assembly is shown with various illustrative, non-limiting dimensions in millimeters. The RF center conductor 441 may be included, for example, in the pin and bead assembly 140 in the RF connection assembly 100, discussed above. The RF center conductor 441 is formed of metal with gold plating, and is electrically connected to a cable/center conductor or other signal conductor (not shown) for conducting electromagnetic signals, such as mmWave RF signals. For example, the RF center conductor 441 may be formed of gold plated beryllium copper, although different materials may be incorporated without departing from the scope of the present teachings.

In the depicted embodiment, the RF center conductor 441 includes an integrally formed clamping mechanism 442 at a distal end portion. The clamping mechanism 442 is configured to provide inward clamping forces on a mated GTMS center conductor, such as GTMS center conductor 163, discussed above. In the depicted embodiment, the RF center conductor 441 is machined into four fingers, as discussed above, for example, by forming two slots in a cross (+) pattern from the distal end toward the body of the RF center conductor 441. Each slot may be about 0.127 mm. Thus, "before slotting" refers to the dimensions before machining the fingers of the clamping mechanism 442. The RF center conductor 441 also includes a collar 443 at a distal tip (which corresponds to a distal tip of the clamping mechanism 442). The collar 443 defines an opening 444. The RF center conductor 441 defines a center socket 445, which extends longitudinally through at least a length of the clamping mechanism 442. The center socket 445 is accessible through the opening 444 in the collar 443. The collar 143 has a smooth inner edge 447 around a perimeter of the opening 444, as discussed below.

In the depicted example, the RF center conductor 441 is configured for use in a 1.85 mm RF connector 110. Therefore, the radius of the smooth inner edge 447 is about 0.100 mm (e.g., 0.100 mm+0.013 mm, in the example), as discussed above. The remaining dimensions are illustrative of a 1.85 mm RF connector 110. Of course, the dimensions may vary, including the radius of the smooth inner edge 447, based at least in part on the size of the RF connector and/or the pin and bead assembly, to provide unique benefits for any particular situation or to meet application specific design requirements of various implementations, as would be apparent to one skilled in the art.

Figure 5:
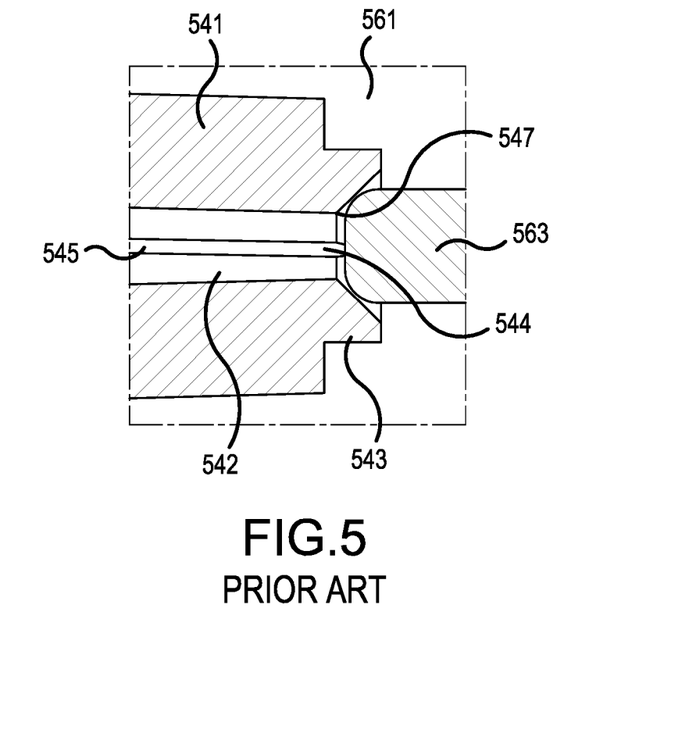
FIG. 5 is a simplified cross-sectional view of a conventional RF center conductor of a conventional pin and bead assembly, for purposes of comparison.

FIG. 5 is a simplified cross-sectional view of a conventional RF center conductor of a conventional pin and bead assembly, provided for purposes of comparison.

Referring to FIG. 5, a portion of an RF connection assembly with a conventional RF center conductor (pin) 541 that includes a clamping mechanism 542 at a distal end portion, and a collar 543 with an opening 544 formed there through. The RF center conductor 541 defines a center socket 545 accessible through the opening 544. The clamping mechanism 542 provides inward clamping forces on an inserted GTMS center conductor.

Notably, the collar 543 has a sharp, chamfered inner edge 547, e.g., at about a 45 degree angle, around a perimeter of the opening 544, as opposed to the smooth inner edge 147, 447 around the perimeter of the opening 144, 444 in the embodiments discussed above. The sharp, chamfered inner edge 547 scrapes gold plating off a GTMS center conductor 563 (e.g., of a GTMS assembly in the RF connection assembly), and may otherwise cause scoring of the gold plating on the GTMS center conductor 563, as it is inserted in (and removed from) the center socket 545 through the opening 544. After insertion of the GTMS center conductor 563, it has reduced thickness of gold plating and gold shavings collected around a base of the GTMS center conductor 563 within its shroud. As discussed above, the gold shavings generally stick upward and/or have irregular shapes, causing the gold shavings to effectively act as antennas that cause mismatch at the transmission line or path, resulting in reduced performance and/or RF failure. The condition of the GTMS center conductor 563 worsens with repeated connections and disconnections.

Figure 6A:
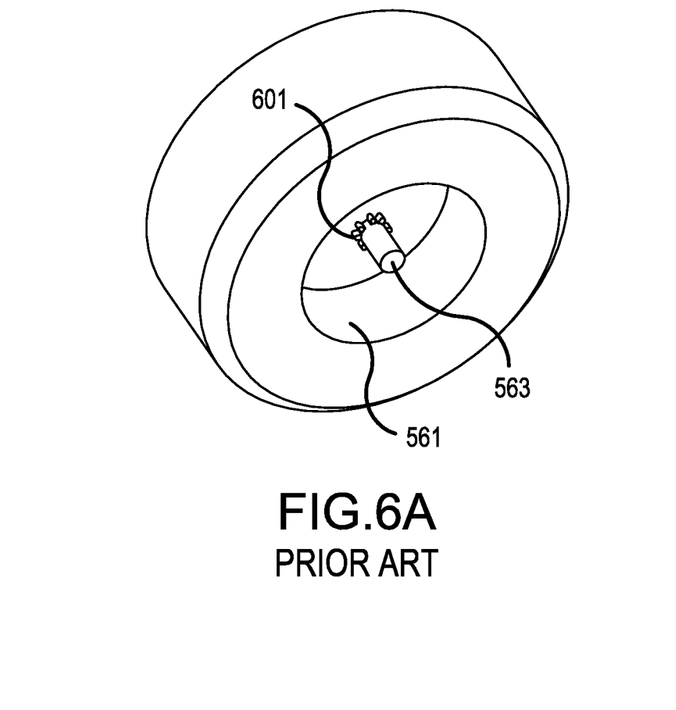
FIG. 6A is a perspective view of a shroud and GTMS center conductor after mating with a conventional RF center conductor.
Figure 6B:
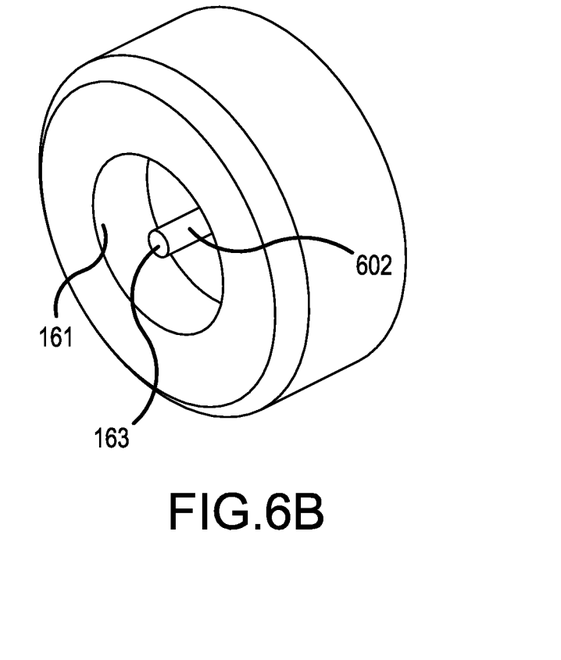
FIG. 6B is a perspective view of a shroud and GTMS center conductor after mating with an RF center conductor, according to a representative embodiment.

FIG. 6A is a perspective view of a shroud and GTMS center conductor after repeated mating with a conventional RF center conductor, and FIG. 6B is a perspective view of a shroud and GTMS center conductor after repeated mating with an RF center conductor, according to a representative embodiment.

In particular, FIG. 6A shows GTMS center conductor 563 within shroud 561 after four insertions into and removals from an RF center conductor through an opening having a sharp, chamfered inner edge around its perimeter, and FIG. 6B shows GTMS center conductor 163 within shroud 161 after four insertions into and removals from an RF center conductor through an opening having a smooth inner edge around its perimeter. The GTMS center conductor 563 has significant gold shavings collected at a base 601 of the GTMS center conductor 563, e.g., caused by scraping and/or scoring of the GTMS center conductor 563, indicating substantial damage to the GTMS center conductor 563 and causing deterioration of electrical connection. In comparison, the GTMS center conductor 163 has little to no gold shavings collected at a base 602 of the GTMS center conductor 163, indicating minimal damage to the GTMS center conductor 163 and resulting in continued strong electrical connection. Also, more gold plating remains on the GTMS center conductor 163, ensuring good conductivity and thus good RF performance. Notably, the small amount of gold shavings shown in FIG. 6B may be easily removed, e.g., between consecutive insertions, with no reworking of the GTMS center conductor 163. For example, the gold shavings may be easily removed using compressed air and/or a tool for manually clearing away the gold shavings.

Figure 7:
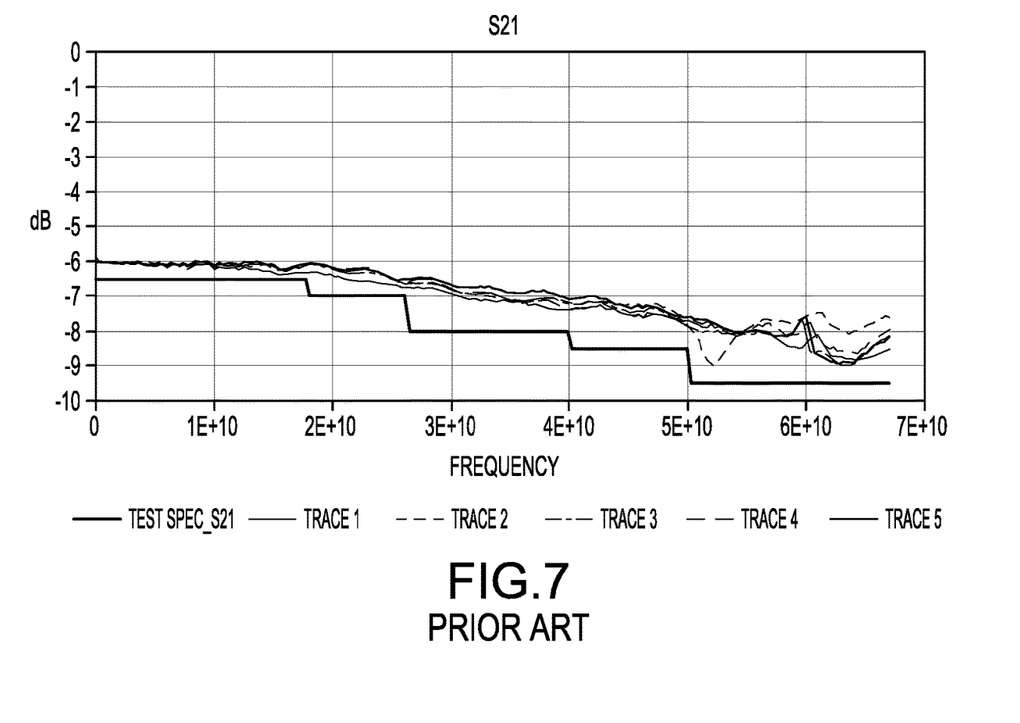
FIG. 7 is a graph showing insertion loss over a range of frequencies during testing of a DUT using a conventional RF center conductor having an opening with a sharp, chamfered inner edge.
Figure 8:
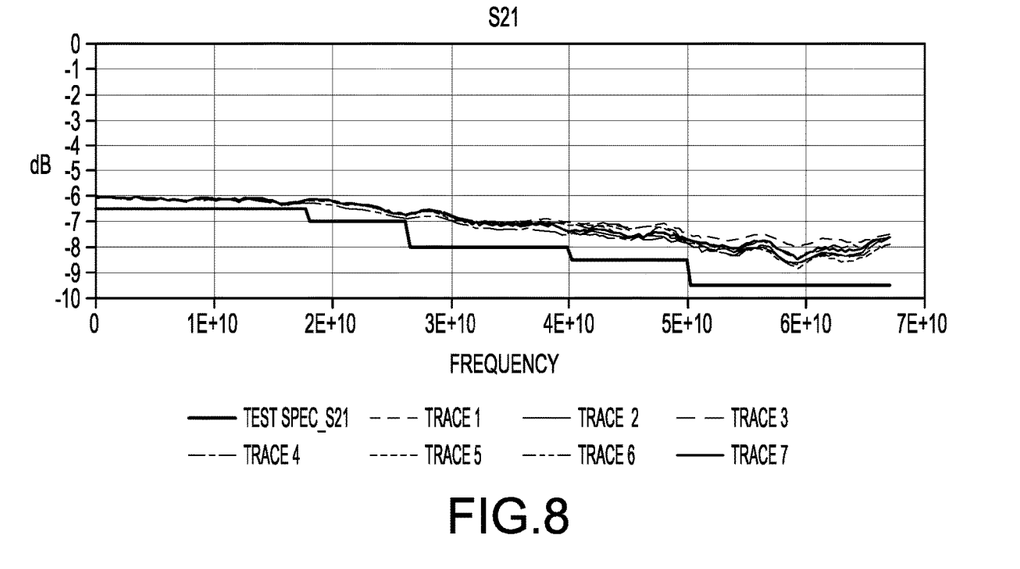
FIG. 8 is a graph showing insertion loss over a range of frequencies during testing of a DUT using an RF center conductor, according to a representative embodiment, having an opening with a smooth inner edge.

FIG. 7 is a graph showing insertion loss (in dB) over a range of frequencies during testing of a DUT (e.g., a DC-67 GHz power splitter) through an RF connection assembly of the DUT with a conventional RF center conductor, having an opening with a sharp, chamfered inner edge (with resulting gold scraping, as shown in FIG. 6A). FIG. 8 is a graph showing insertion loss (in dB) over a range of frequencies during testing of a DUT (e.g., a DC-67 GHz power splitter) through an RF connection assembly of the DUT with an RF center conductor, e.g., for connecting a DC-67 GHz power splitter, according to a representative embodiment, having an opening with a smooth inner edge (with resulting minimal gold scraping, as shown in FIG. 6B). The DUTs may be connected to a performance network analyzer, for example, through the RF connection assembly to provide measurement results.

Referring to FIG. 7, the insertion loss (S-parameter S21) is shown for five signals provided to a DUT using the conventional RF center conductor having an opening with a sharp, chamfered inner edge. The stepped line shows a test specification of the S-parameter S21, which provides the floor of acceptable results. The insertion loss of the five signals is shown by five traces, respectively, which have significant variations among the multiple tests as the gold plating is scraped from the GTMS center conductor after only one connection (e.g., a permanent connection) between the GTMS assembly and the conventional pin and bead assembly. Comparison of the five traces shows that the insertion loss is erratic, indicating mismatch at the transmission line and thus less reliable signaling. The test results are likewise less reliable, particularly at higher frequencies (e.g., greater than about 50 GHz). Indeed, the largest variations between two of the insertion loss signals is about 1.3 dB at about 53 GHz and about 1.2 dB at about at about 62 GHz. The observed performance trend is inconsistent, not meeting intent of design.

In comparison, referring to FIG. 8, the insertion loss (S-parameter S21) is shown for seven signals provided to a DUT using the RF center conductor, according to a representative embodiment, having an opening with a smooth inner edge. Again, the stepped line shows a test specification of the S-parameter S21, which provides the floor of acceptable results. The insertion loss of the seven signals is shown by seven traces, respectively, which have minimal variations among the multiple tests as very little gold plating is scraped from the GTMS center conductor after repeated connections (e.g., up to four connections) between the GTMS assembly and the embodiment of the pin and bead assembly. Comparison of the seven traces shows that the insertion loss is consistent, indicating reliable signaling and thus reliable test results, even at higher frequencies (e.g., greater than about 50 GHz), even after more than just one connection.

The largest variation between two of the insertion loss signals is only about 0.8 dB at about 59 GHz. Thus, the S-parameter performance is improved, where S-parameter S21, in particular, improves by about 0.5 dB to about 1.0 dB with better stability, as compared to the S-parameter S21 depicted in FIG. 7. The observed performance trend shows high reliability, consistency and repeatability close to intent of design, especially for the frequency range of interest, from about 50 GHz to about 67 GHz. The graph in FIG. 8 shows that the RF connection assemblies according to representative embodiments are still able to maintain good RF performance and consistently meet intent of design, even up to four times of connection and disconnection (e.g., with minor cleaning of GTMS center conductor after one or more of the connection and disconnection, as discussed above).

Figure 9:
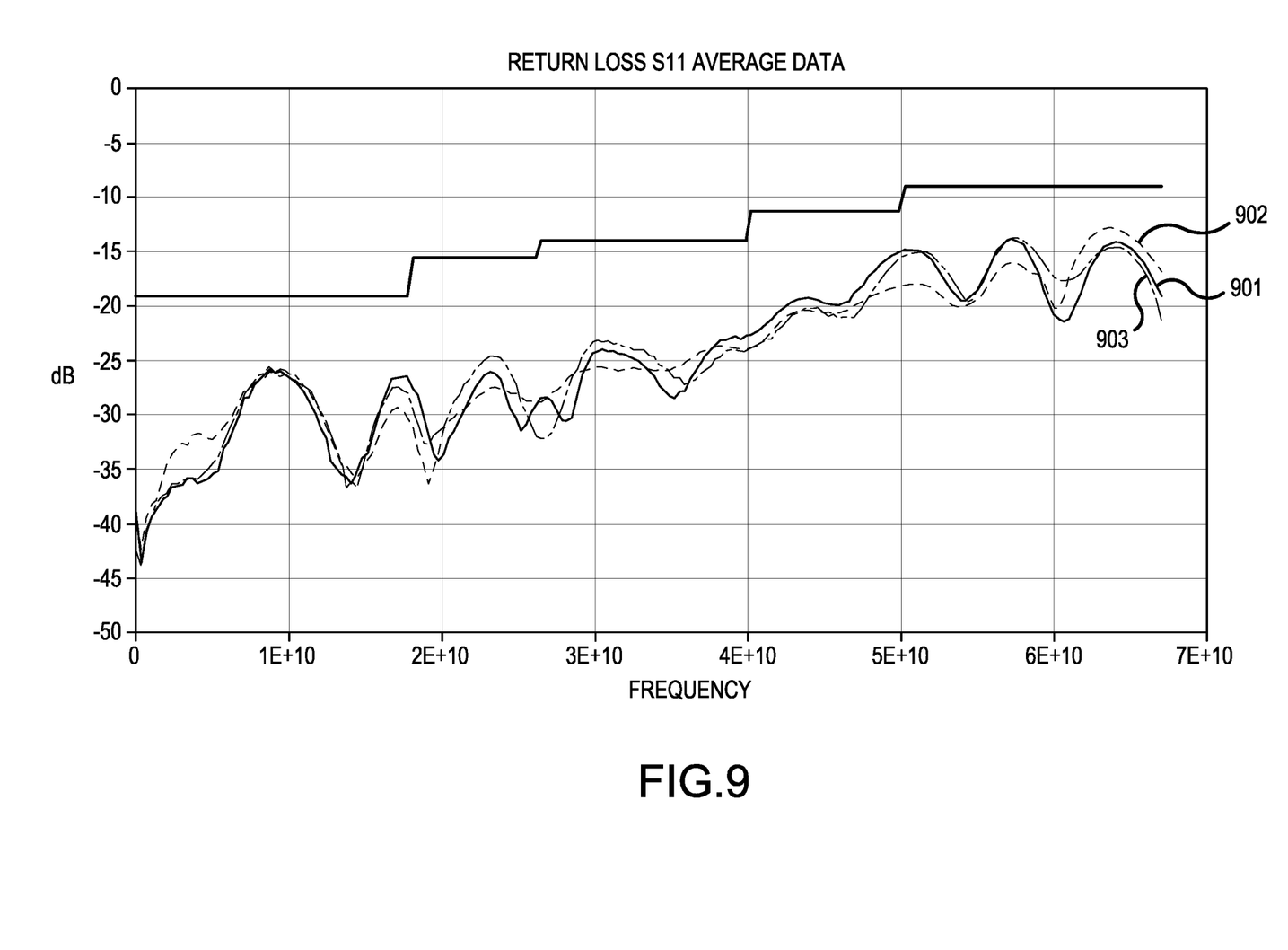
FIG. 9 is a graph showing comparisons of return loss during testing of a DUT using a conventional RF center conductor having an opening with a sharp, chamfered inner edge and using an RF center conductor, according to a representative embodiment, having an opening with a smooth inner edge.
Figure 10:
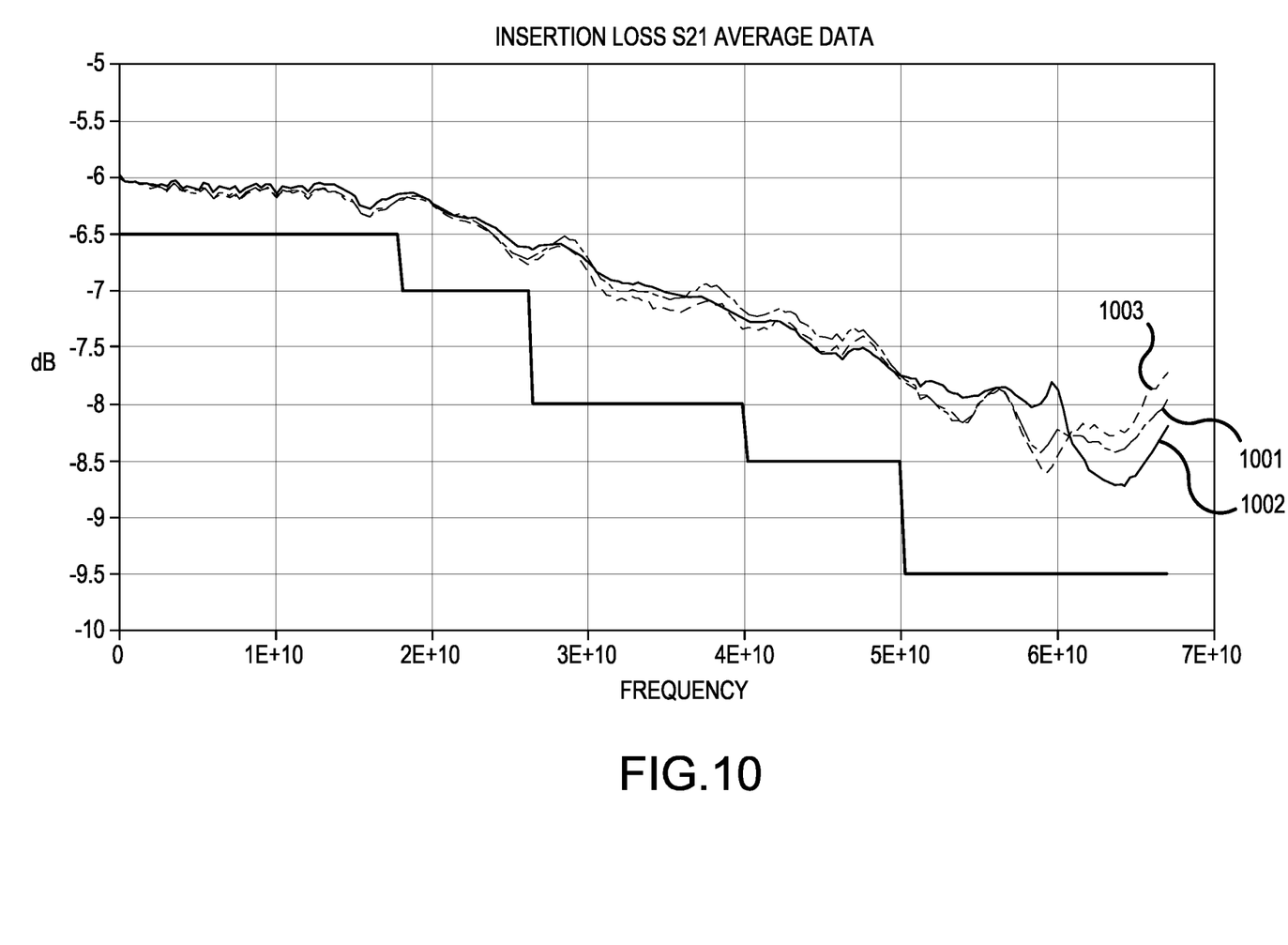
FIG. 10 is a graph showing comparisons of insertion loss during testing of a DUT using a conventional RF center conductor having an opening with a sharp, chamfered inner edge and using an RF center conductor, according to a representative embodiment, having an opening with a smooth inner edge.

FIG. 9 is a graph showing comparisons of average return loss (in dB) over a range of frequencies during testing of a DUT (e.g., a DC-67 GHz power splitter) through an RF connection assembly of a DUT with a conventional RF center conductor having an opening with a sharp, chamfered inner edge (with resulting gold scraping, as shown in FIG. 6A) and also through an RF connection assembly of a DUT with an RF center conductor, according to a representative embodiment, having an opening with a smooth inner edge (with resulting minimal gold scraping, as shown in FIG. 6B). FIG. 10 is a graph showing comparisons of average insertion loss (in dB) over a range of frequencies during testing of a DUT (e.g., a DC-67 GHz power splitter) through a conventional RF center conductor having an opening with a sharp, chamfered inner edge (with resulting gold scraping, as shown in FIG. 6A) and also through an RF center conductor of a DUT, according to a representative embodiment, having an opening with a smooth inner edge (with resulting minimal gold scraping, as shown in FIG. 6B). The DUTs may be connected to a performance network analyzer, for example, through the RF connection assembly to provide measurement results.

Referring to FIG. 9, the average return loss (S-parameter S11) is shown by three traces representing averaged return loss signals, each based on multiple return loss signals provided by a DUT (e.g., a DC-67 GHz power splitter). The stepped line shows a test specification of the S-parameter S11, which provides the ceiling of acceptable results. Trace 901 shows the average return loss, using a conventional RF center conductor having an opening with a sharp, chamfered inner edge, after one connection between the conventional RF connector and the GMTS connector. Trace 902 shows the average return loss, using the conventional RF center conductor having the opening with a sharp, chamfered inner edge, after making two connections between the conventional RF connector and the GMTS connector. Trace 903 shows the average return loss, using an RF center conductor, according to a representative embodiment (e.g., as shown in FIGS. 3A and 3B) having an opening with a smooth inner edge, after one (permanent) connection between an improved RF connector (e.g., RF connector 110) and the GMTS connector (e.g., GTMS connector 150), resulting in 100 percent passing rate. For testing purposes, the RF connector 110 and the GTMS connector 150 were connected/disconnected up to four times (with minor cleaning of the GTMS center conductor in between, as discussed above), resulting in 100 percent passing rate each time.

Comparison of trace 902 with trace 901 shows that, when using the conventional RF center conductor with the sharp, chamfered inner edge, the average return loss worsens with repeated use (indicated by trace 902) at high frequencies, in particular, over about 63 GHz. So, for example, at about 64 GHz, trace 902 shows an average return loss that is about 1.1 dB worse than the average return loss shown by trace 901. Comparison of trace 903 with each of trace 901 and trace 902 shows that using the RF center conductor with the smooth inner edge, according to a representative embodiment, improves the average return loss over both the single and repeated uses of the conventional RF center conductor at high frequencies, in particular, over about 63 GHz. For example, at about 67 GHz, trace 903 shows about a 2.2 dB improvement in average return loss over trace 901, and about 4.4 dB improvement in average return loss over trace 902. Comparison of trace 903 with each of trace 901 and trace 902 further indicates the trend of worsening average return loss following repeated use of the conventional RF center conductor, as additional scoring occurs and/or additional gold plating is scraped from the GTMS center conductor causing mismatch, for example, as discussed above.

Referring to FIG. 10, the average insertion loss (S-parameter S21) is shown by three traces representing averaged insertion loss signals, each based on multiple insertion loss signals provided by a DUT (e.g., a DC-67 GHz power splitter). The stepped line shows a test specification of the S-parameter S21, which provides the floor of acceptable results. Trace 1001 shows the average insertion loss, using a conventional RF center conductor having an opening with a sharp, chamfered inner edge, after one connection between the conventional RF connector and the GMTS connector. Trace 1002 shows the average insertion loss, using the conventional RF center conductor having the opening with a sharp, chamfered inner edge, after making two connections between the conventional RF connector and the GMTS connector. Trace 1003 shows the average insertion loss, using an RF center conductor, according to a representative embodiment (e.g., as shown in FIGS. 3A and 3B) having an opening with a smooth inner edge, after one (permanent) connection between an improved RF connector (e.g., RF connector 110) and the GMTS connector (e.g., GTMS connector 150), resulting in 100 percent passing rate.

Comparison of trace 1002 with trace 1001 shows that, when using the conventional RF center conductor with the sharp, chamfered inner edge, the average insertion loss worsens with repeated use (indicated by trace 1002) at high frequencies, in particular, over about 61 GHz. So, for example, at about 64 GHz, trace 1002 shows an average insertion loss that is about 0.3 dB worse than the average insertion loss shown by trace 1001. Comparison of trace 1003 with each of trace 1001 and trace 1002 shows that using the RF center conductor with the smooth inner edge, according to a representative embodiment, improves the average insertion loss over both the single and repeated uses of the conventional RF center conductor at high frequencies, in particular, over about 61 GHz. For example, at about 64 GHz, trace 1003 shows about a 0.2 dB improvement in average insertion loss over trace 1001, and about 0.5 dB improvement in average insertion loss over trace 1002. Comparison of trace 1003 with each of trace 1001 and trace 1002 further indicates the trend of worsening average insertion loss following repeated use of the conventional RF center conductor, as additional scoring occurs and/or additional gold plating is scraped from the GTMS center conductor, discussed above. Also, for testing purposes, the RF connector and the GTMS connector were connected/disconnected up to four times (with minor cleaning of the GTMS center conductor in between, as discussed above), resulting in 100 percent passing rate each time.

Generally, in terms of passing rates for DUTs (e.g., the DC-67 GHz power splitter) being tested via RF connectors, use of the RF center conductor, according to a representative embodiment, provides significant improvement. For example, through empirical testing, it has been observed that using a conventional RF center conductor with the sharp, chamfered inner edge for a one-time connection yields passing rates of about 75 percent, and for two-time connections yields passing rates of about 30 percent. In comparison, using an RF center conductor with the smooth inner edge, according to a representative embodiment, yields passing rates of about 100 percent. In addition, the RF connector including the RF center conductor with the smooth inner edge more consistently meets product intent of design, as compared to the conventional RF connector including the RF center conductor with the sharp, chamfered inner edge.

Figure 11:
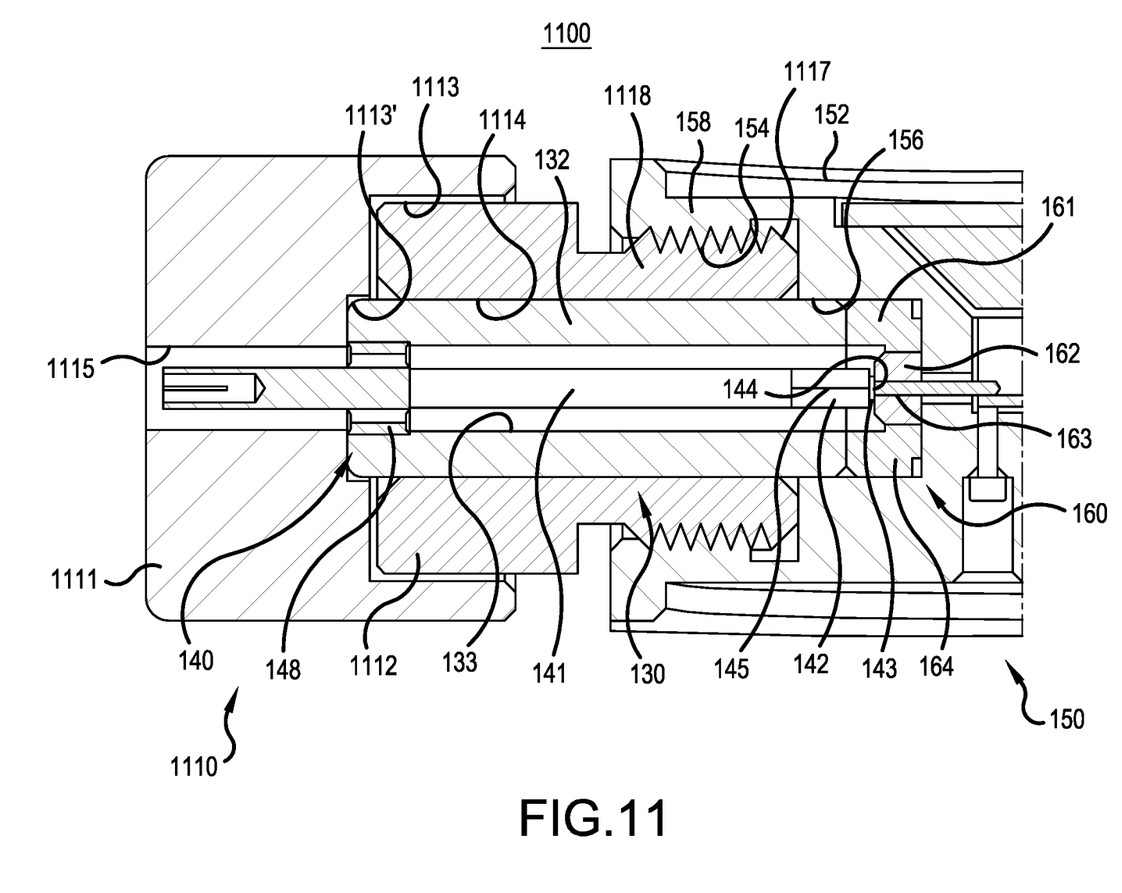
FIG. 11 is a simplified cross-sectional view of an RF connection assembly including a pusher, in a connected state, according to a representative embodiment.

FIG. 11 is a simplified cross-sectional view of an RF connection assembly including a pusher, in a connected state, according to a representative embodiment. The RF connection assembly may be for establishing signal connections for DC to mmWave RF signals, for example.

Referring to FIG. 11, RF connection assembly 1100 includes an RF connector 1110 with the RF connector sub-assembly 130, and a GTMS connector 150. The RF connector 1110 includes a pusher 1111 and a modified outer conductor 1112. The pusher 1111 defines an outer opening 1113 with a stepped portion 1113' and an inner opening 1115, and the modified outer conductor 1112 defines an opening 1114. The opening 1114 of the modified outer conductor 1112 may be substantially cylindrically shaped, and extends through the modified outer conductor 1112 from a distal end to a proximal end. Threading 1118 is on an outer surface of an end portion 1117 of the modified outer conductor 1112, enabling a thread-in connection with the GTMS connector 150 in a connected state, as discussed below. The outer opening 1113 of the pusher 1111 may be substantially cylindrically shaped, and opens at a distal end of the pusher 1111. The stepped portion 1113' is narrower in diameter than the outer opening 1113 (providing a stepped structure), and is formed at a bottom of the outer opening 1113, extending it proximally. The inner opening 1115 may also be substantially cylindrically shaped, and further extends through the pusher 1111 from a bottom of the stepped portion 1113'. In the depicted embodiment, the inner opening 1115 has a diameter smaller than a diameter of each of the outer opening 1113 and the stepped portion 1113'.

The RF connector sub-assembly 130 includes a sleeve 132 that defines a core opening 133, which extends longitudinally through an entire length of the sleeve 132. The sleeve 132 may be formed of beryllium copper, for example. The RF connector sub-assembly 130 further includes a pin and bead assembly 140, which is insertably positioned in the core opening 133 of the sleeve 132. The pin and bead assembly 140 includes an RF center conductor 141 and a bead 148 surrounding the RF center conductor 141 at a waist portion of the RF center conductor 141. The bead 148 has a bead outer diameter, which is substantially the same as an inner diameter of the core opening 133, and the bead 148 has a bead inner diameter, which is substantially the same as an outer diameter of the RF center conductor 141. Therefore, the RF center conductor 141 is securely fitted within the bead 148, and the bead 148 is securely fitted within the core opening 133 of the sleeve 132, such that the bead 148 secures the RF center conductor 141 at a proximal end of the sleeve 132 in which the RF center conductor 141 is inserted. In an embodiment, the RF center conductor 141 may have a small step of undercut to further secure the bead 148 at a fixed location on the RF center conductor 141, as discussed above.

In the assembled state, an end portion of the sleeve 132 fits into the opening 1114 of the modified outer conductor 1112 and the stepped portion 1113' of the outer opening 1113. The end of the RF center conductor 141 that extends beyond the sleeve 132 fits into the inner opening 1115 of the pusher 1111.

The RF center conductor 141 is formed of metal with gold plating, and is electrically connected to a cable (center conductor) or other signal conductor (not shown) for conducting electromagnet signals, such as mmWave RF signals. For example, the RF center conductor 141 may be formed of gold plated beryllium copper, although different materials may be incorporated without departing from the scope of the present teachings.

As discussed above, the RF center conductor 141 includes a clamping mechanism 142 at a distal end portion. The clamping mechanism 142 is configured to provide a good quality connection with a mating part from the GTMS connector 150, such as GTMS center conductor 163. The RF center conductor 141 also includes a collar 143 at a distal tip of the RF center conductor 141 (which corresponds to a distal tip of the clamping mechanism 142, as well). The collar 143 defines an opening 144. The RF center conductor 141 defines a center socket 145, which extends longitudinally through at least a length of the clamping mechanism 142, and may further extend past the end of the clamping mechanism 142 into the body of RF center conductor 141. The center socket 145 is accessible through the opening 144 in the collar 143. As discussed above, the collar 143 has a smooth inner edge, such as the smooth inner edge 147, around a perimeter of the opening 144. The smooth inner edge 147 may be rounded, as discussed above with reference to FIGS. 2A and 2B, for example.

The GTMS connector 150 includes a GTMS housing 152, with an outer opening 154 and an inner opening 156 formed in the GTMS housing 152. The outer opening 154 may be substantially cylindrically shaped, and extends partially through the GTMS housing 152 from a distal end of the GTMS connector 150. The inner opening 156 may also be substantially cylindrically shaped, and further extends partially through the GTMS housing 152 from a bottom portion of the outer opening 154. In the depicted embodiment, the inner opening 156 has a diameter smaller than a diameter of the outer opening 154. Threading 158 is on an inner surface of an end portion of the outer opening 154, enabling a thread-in connection between the threading 158 and the threading 1118 on the outer surface of the end portion of the modified outer conductor 1112 to provide a secure connection.

The GTMS connector 150 further includes a GTMS assembly 160 positioned within the inner opening 156. The GTMS assembly 160 includes a shroud 161, glass insulation 162 filling a portion of the shroud 161, and a GTMS center conductor 163. The glass insulation 162 defines an inner recess 164 within the shroud 161, which corresponds to a portion of the shroud 161 not filled by the glass insulation 162. The GTMS center conductor 163 is secured in place by the glass insulation 162, and protrudes from the inner recess 164, extending beyond an outer edge of the shroud 161. The GTMS center conductor 163 is formed of metal with gold plating, and is electrically connected to a cable (center conductor) or other signal conductor (not shown) for conducting electromagnet signals, such as mmWave RF signals.

In the depicted embodiment, when fully connected, an end portion of the sleeve 132 is inserted in the inner opening 156 of the GTMS housing 152, and abuts the GTMS assembly 160. At the same time, the end portion 1117 of the modified outer conductor 1112 is inserted in the outer opening 154 of the GTMS housing 152. In this case, the threading 1118 on the outer surface of the end portion 1117 of the modified outer conductor 1112 and the threading 158 is on the inner surface of an end portion of the outer opening 154 form a thread-in connection. Of course, other types of interconnection between the modified outer conductor 1112 and the GTMS housing 152 may be incorporated, without departing from the scope of the present teachings.

Once the modified outer conductor 1112 is connected to the GTMS housing 152, the RF connector sub-assembly 130, including the pin and bead assembly 140 in the core opening 133 of the sleeve 132, is inserted into the opening 1114 of the modified outer conductor 1112, until the pin and bead assembly 140 and the sleeve 132 are near or come into contact with the GTMS assembly 160 positioned within the inner opening 156. The RF connector sub-assembly 130 may be manually inserted, for example.

The pusher 1111 may then be placed over the exposed proximal ends of the RF connector sub-assembly 130 and the modified outer conductor 1112. This causes a proximal end of the RF center conductor 141 to enter the inner opening 1115, a proximal end of the sleeve 132 to enter the stepped portion 1113', and a proximal end of the modified outer conductor 1112 to enter the outer opening 1113 of the pusher 1111. Applying force to the pusher 1111 toward the GTMS housing 152 causes an end portion of the RF center conductor 141 to be inserted in the shroud 161 of the GTMS assembly 160, such that the end of the collar 143 of the RF center conductor 141 abuts an exposed surface of the glass insulation 162. In this position, the GTMS center conductor 163 of the GTMS assembly 160 is likewise inserted in the center socket 145 of the RF center conductor 141 through the opening 144. The GTMS center conductor 163 slides past the smooth inner edge 147 around the perimeter of the opening 144 as it is being inserted. The clamping mechanism 142 exerts an inward clamping force on the GTMS center conductor 163 to help hold the GTMS center conductor 163 in place. The force may be manually applied to the pusher 1111 in order to press the end portion of the RF center conductor 141 into the shroud 161, and to press the GTMS center conductor 163 into the center socket 145 of the RF center conductor 141 through the opening 144.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed:

1. A radio frequency (RF) connection assembly for DC to mmWave signals, the RF connection assembly comprising:
    a glass-to-metal seal (GTMS) assembly comprising a shroud, glass insulation filling a portion of the shroud to define an inner recess, and a GTMS center conductor secured by the glass insulation and protruding from the inner recess of the shroud, the GTMS center conductor having gold plating; and
    a pin and bead assembly comprising an RF center conductor including a clamping mechanism having a collar at a distal end of the RF center conductor, and a center socket defined at least in part by the clamping mechanism, the center socket being accessible through an opening formed in the collar,
    wherein the collar has a smooth inner edge around a perimeter of the opening, the smooth inner edge being configured to guide a tip of the GTMS center conductor into the center socket of the RF center conductor for connecting the GTMS assembly and the pin and bead assembly, minimizing scraping of the gold plating from the GTMS center conductor by the smooth inner edge of the opening.

2. The RF connection assembly of claim 1, wherein the clamping mechanism comprises a plurality of fingers surrounding the center socket, the plurality of fingers exerting a clamping force on the GTMS center conductor of the GTMS assembly when the GTMS center conductor is inserted through the opening of the collar into the center socket.

3. The RF connection assembly of claim 1, wherein the smooth inner edge around the perimeter of the opening comprises a rounded smooth inner edge having a radius of about 0.100 mm for a 1.85 mm RF connector including the pin and bead assembly and a 2.40 mm RF connector including the pin and bead assembly.

4. The RF connection assembly of claim 1, wherein the smooth inner edge around the perimeter of the opening comprises a rounded smooth inner edge having a radius of about 0.020 mm for a 1.00 mm RF connector including the pin and bead assembly.

5. The RF connection assembly of claim 1, wherein the smooth inner edge around the perimeter of the opening comprises a rounded smooth inner edge having a radius of about 0.150 mm for a 3.50 mm RF connector including the pin and bead assembly.

6. The RF connection assembly of claim 1, wherein the RF center conductor is formed of beryllium copper to which the gold plating is plated.

7. The RF connection assembly of claim 1, further comprising:
    a GTMS housing defining an outer opening and an inner opening having a smaller diameter than the outer opening, wherein the GTMS assembly is positioned in the inner opening of the GTMS housing.

8. The RF connection assembly of claim 7, further comprising:
    an RF connector sub-assembly comprising the pin and bead assembly and a sleeve defining a core opening, the pin and bead assembly being positioned in the core opening; and
    an outer conductor defining an outer opening, the RF connector sub-assembly being positioned in the outer opening,
    wherein an end portion of the outer conductor is insertable in the outer opening of the GTMS housing, such that the collar of the pin and bead assembly is in contact with the inner recess of the shroud when the GTMS center conductor of the GTMS assembly is fully inserted in the center socket of the RF center conductor of the pin and bead assembly.

9. The RF connection assembly claim 8, wherein an inner surface of the outer opening of the GTMS housing is threaded, and an outer surface of the end portion of the outer conductor is complementarily threaded, enabling a thread-in connection.

10. The RF connection assembly claim 1, wherein the GTMS assembly is a 2.40 mm GTMS assembly for connecting with a 1.85 mm RF connector including the pin and bead assembly for mmWave signal bands having an upper frequency of about 70 GHz.

11. The RF connection assembly claim 1, wherein the GTMS assembly is a 2.40 mm GTMS assembly for connecting with a 2.40 mm RF connector including the pin and bead assembly for mmWave signal bands having an upper frequency of about 50 GHz.

12. The RF connection assembly claim 1, wherein the GTMS assembly is a 3.50 mm GTMS assembly for connecting with a 3.50 mm RF connector including the pin and bead assembly for mmWave signal bands having an upper frequency of about 34 GHz.

13. The RF connection assembly claim 1, wherein the GTMS assembly is a 1.00 mm GTMS assembly for connecting with a 1.00 mm RF connector including the pin and bead assembly for mmWave signal bands having an upper frequency of about 110 GHz.

14. The RF connection assembly claim 1, wherein the RF connection assembly connects a device under test (DUT) to a test instrument.

15. The RF connection assembly of claim 1, wherein the smooth inner edge around the perimeter of the opening comprises a multiple angled inner edge.

16. A pin and bead assembly in a radio frequency (RF) connector for DC to mmWave signals and configured to connect to a glass-to-metal seal (GTMS) connector that includes a shroud, glass insulation filling a portion of the shroud to define an inner recess, and a GTMS center conductor secured by the glass insulation and protruding from the inner recess of the shroud, the GTMS center conductor having gold plating, the pin and bead assembly comprising:
    an RF center conductor;
    a bead surrounding the RF center conductor and configured to secure the RF center conductor at a proximal end of a sleeve in which the RF center conductor is inserted;
    a clamping mechanism at a distal end of the RF center conductor, the clamping mechanism defining, at least in part, a center socket; and
    a collar at a distal end of the clamping mechanism, the center socket being accessible through an opening formed in the collar, wherein the collar has a smooth inner edge around a perimeter of the opening, the smooth inner edge being configured to guide a tip of the GTMS center conductor into the center socket of the RF center conductor for connecting the GTMS connector and the RF connector, the smooth inner edge minimizing scraping of the gold plating from the GTMS center conductor.

17. The pin and bead assembly of claim 16, wherein the clamping mechanism comprises a plurality of fingers surrounding the center socket, the plurality of fingers exerting a clamping force on the GTMS center conductor of the GTMS connector when the GTMS center conductor is inserted through the opening of the collar into the center socket.

18. The pin and bead assembly of claim 16, wherein the smooth inner edge around the perimeter of the opening comprises a rounded smooth inner edge having a radius between about 0.020 mm and about 0.150 mm.

19. A radio frequency (RF) connection assembly for DC to mmWave signals, the RF connection assembly comprising:
   a glass-to-metal seal (GTMS) assembly comprising a shroud, glass insulation filling a portion of the shroud to define an inner recess, and a GTMS center conductor secured by the glass insulation and protruding from the inner recess of the shroud, the GTMS center conductor having gold plating;
   a pin and bead assembly comprising an RF center conductor including a clamping mechanism having a collar at a distal end of the RF center conductor, and a center socket defined at least in part by the clamping mechanism, the center socket being accessible through an opening formed in the collar; and
   a pusher configured to press the pin and bead assembly through an opening in an outer conductor into the GTMS assembly, in response to an externally applied force, which causes the GTMS center conductor to enter the center socket of the RF center conductor, connecting the GTMS assembly and the pin and bead assembly,
   wherein the collar has a smooth inner edge around a perimeter of the opening, the smooth inner edge being configured to guide a tip of the GTMS center conductor into the center socket of the RF center conductor, minimizing scraping of the gold plating from the GTMS center conductor by the smooth inner edge of the opening.

20. The RF connection assembly of claim 19, wherein the smooth inner edge around the perimeter of the opening comprises a rounded smooth inner edge.

* * * * *